United States Patent
Dings et al.

[11] Patent Number: 5,910,396
[45] Date of Patent: Jun. 8, 1999

[54] METHOD OF PATTERNED ERODING OF A COATING PROVIDED ON A SUBSTRATE

[75] Inventors: Jacobus M. Dings; Remko Horne; Gerardus N. A. Van Veen, all of Eindhoven, Netherlands

[73] Assignee: U.S. Philips Corporation, New York, N.Y.

[21] Appl. No.: 09/017,036

[22] Filed: Feb. 2, 1998

Related U.S. Application Data

[62] Division of application No. 08/523,834, Sep. 6, 1995, Pat. No. 5,789,853.

[30] Foreign Application Priority Data

Sep. 6, 1994 [EP] European Pat. Off. .............. 94202544

[51] Int. Cl.$^6$ .............................. H01J 9/00; B24B 1/00; G03F 7/00
[52] U.S. Cl. .............................. 430/323; 445/24; 451/29; 451/30
[58] Field of Search .............................. 430/323, 325; 445/24; 451/29, 30, 31

[56] References Cited

U.S. PATENT DOCUMENTS 5,833,516 11/1998 De Haas et al. .......................... 451/29

FOREIGN PATENT DOCUMENTS

| 2-301934 | 12/1990 | Japan . |
| 3-294180 | 12/1991 | Japan . |
| 4-104424 | 4/1992 | Japan . |

*Primary Examiner*—John A. McPherson
*Attorney, Agent, or Firm*—F. Brice Faller

[57] ABSTRACT

In a method in which a top coating (2) on a relatively hard substrate (1) is patterned by means of a stream of kinetic particles while being masked by a mask (3), the substrate (1) is coated with a damping layer (4) of a ductile material before the top coating (2) is provided.

16 Claims, 1 Drawing Sheet

METHOD OF PATTERNED ERODING OF A COATING PROVIDED ON A SUBSTRATE

CROSS REFERENCE TO RELATED APPLICATIONS

This is a divisional of application Ser. No. 08/523,834, filed Sep. 6, 1995, now U.S. Pat. No. 5,789,853.

BACKGROUND OF THE INVENTION

1. Field of the Invention

The invention relates to a method of patterning a top coating on a substrate, which top coating is provided on a relatively hard substrate and, while being masked by a mask, is exposed to a stream of kinetic particles.

2. Description of the Related Art

The invention particularly relates to such a method in which the top coating is patterned by means of (powder) spraying. As an alternative to a frequently isotropic etching treatment for patterning the top coating, (powder) spraying is generally quicker and has the additional advantage that the material of the top coating is more directionally taken off so that a sharper and better defined pattern can be obtained.

By using a relatively hard substrate as a base, i.e. a substrate which is harder than its top coating and is thus resistant to the stream of kinetic particles, the process automatically stops where the top coating has been removed over its entire thickness and the underlying substrate is reached so that the method should in principle be relatively insensitive to local process fluctuations.

Nevertheless, local deviations in the ultimate pattern of the top coating are still found in practice when, for example a conventional (powder) spraying process is used. Particularly, the ultimate pattern appears to be locally attacked at its base and has sometimes even entirely disappeared locally.

SUMMARY OF THE INVENTION

It is an object of the present invention to provide a method of the type described in the opening paragraph, in which such a breakdown of the top coating pattern is effectively inhibited.

The invention is based on the recognition that the local breakdown of the pattern of the top coating is caused by kinetic particles which are scattered on the surface of the relatively hard substrate as soon as they reach the substrate. The particles which are thus substantially scattered non-elastically are reflected towards the base of the pattern and are thus capable of attacking the top coating pattern.

To inhibit this phenomenon, a method of the type described in the opening paragraph is characterized in that the substrate is coated with a damping layer before the top coating is provided. A damping layer is understood to mean a layer which is capable of adequately absorbing the kinetic energy of the particles. An embodiment of the method according to the invention, in which the top coating is patterned by means of powder spraying, is characterized in that the substrate is coated with a damping layer of aluminium before the top coating is provided. In practice, the relatively ductile aluminium layer appears to be capable of absorbing the kinetic energy of the powder particles to a sufficient extent so as to neutralize the particles effectively as soon as the top coating has disappeared throughout its thickness. It is thereby avoided that the particles are scattered when they reach the base of the top coating and are reflected towards the (base of) the top coating pattern.

In a particular embodiment of the method according to the invention the starting material for the top coating is a bound suspension such as, for example a glass paste which is provided on the damping layer, subsequently cured, at least dried and coated with a photoresist layer from which the mask is formed by selective exposure and development. The rate of erosion of such a cured or dried suspension is generally very large and particularly larger than that of the developed photoresist layer. Thus, a photoresist mask may be used advantageously, which in contrast to a mechanical mask does not need to have an internal coherence and can be very accurately manufactured and aligned by using existing, very sophisticated photolithographic techniques.

More particularly, a substrate of glass is used in an embodiment of the method according to the invention and the starting material for the top coating is a glass paste. Thus, an arbitrary glass pattern may be provided on a glass substrate according to the invention. The invention is therefore eminently suitable for use in the manufacture of flat panel picture display devices, in which structured plates, particularly of glass are frequently used.

The invention also relates to a flat-panel display device having a substrate of a first hard and brittle material having a first hardness, on which a pattern-eroded layer of a second hard and brittle material having a second, lower hardness is provided, a layer of a ductile material being present between the substrate and the layer.

Particularly, the eroded layer has a pattern of narrow walls and is thus suitable, for example, for use as a channel plate in a flat-panel display device as described in U.S. Pat. No. 5,313,136, or a pattern of pillars and is thus suitable, for example, for use in a field emission display as described in U.S. Pat. No. 5,371,433. Moreover, the invention is very suitable for use in plasma displays. In these applications, an apertured spacer plate is often provided on the wall or pillar structure. A system of addressing electrodes provided with apertures aligned with the apertures in the spacer plate is often added to the plate.

BRIEF DESCRIPTION OF THE DRAWINGS

These and other aspects of the invention will be apparent from and elucidated with reference to the embodiments described hereinafter.

The Figures are purely diagrammatic and not to scale. For the sake of clarity, some dimensions are exaggerated. In the Figures, corresponding components have been denoted by identical reference numerals as much as possible.

DESCRIPTION OF THE PREFERRED EMBODIMENTS

Figure 1:
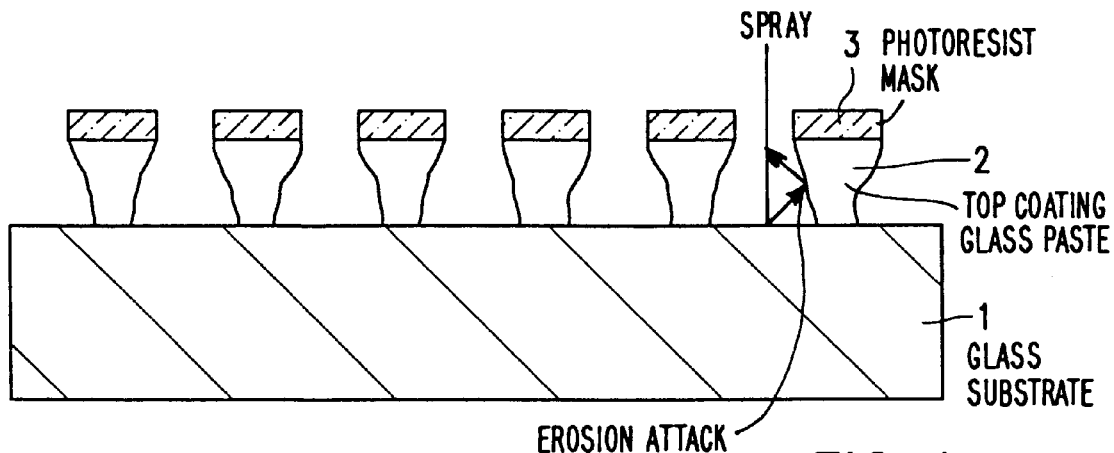
FIG. 1 shows a substrate with a top coating which has been patterned by using a conventional powder spraying process.

The embodiment of FIG. 1 starts from a substrate 1 of glass on which an approximately 180 $\mu$m thick top coating 2 of, for example glass paste is provided by means of, for example a silk-screening technique. The top coating 2 is subsequently dried so as to obtain a solid layer of glass grains which are held together by means of a few tenths of percent by weight of a binder. The cured top coating 2 is subsequently provided with a photoresist layer from which a photoresist mask 3 is manufactured by selective exposure and development in the conventional manner.

While masking the mask 3, the top coating 2 is exposed to a powder spraying process of aluminium oxide grains. To structure the top coating 2 in a controlled manner, such a low spraying pressure is used that the speed of the spraying particles is low enough to prevent plastic deformation of or cracks in the underlying substrate. After their collision with the substrate, the particles thus still have sufficient energy to be scattered into all directions. Such a substantially non-elastic scattering of particles is presumably the cause of attack of the top coating pattern 2, notably of its base as is shown in FIG. 1. Notably with very fine column or line structures, this attack may in practice have such consequences that the pattern is entirely sprayed off or broken down locally at its base.

Figure 2:
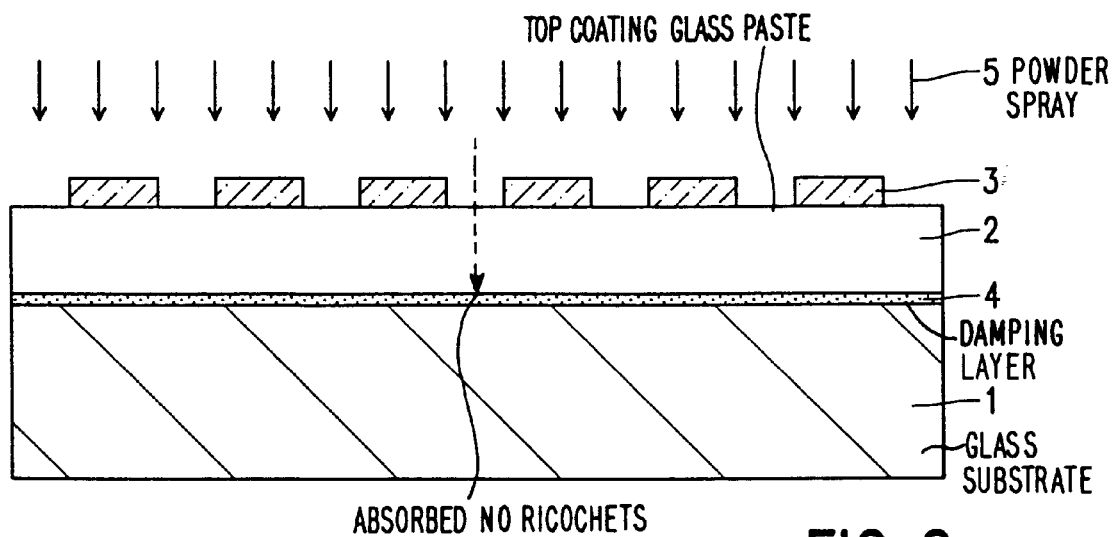
FIGS. 2–3 show successive steps of an embodiment of the method according to the invention, in which a top coating on a substrate is patterned.
Figure 3:
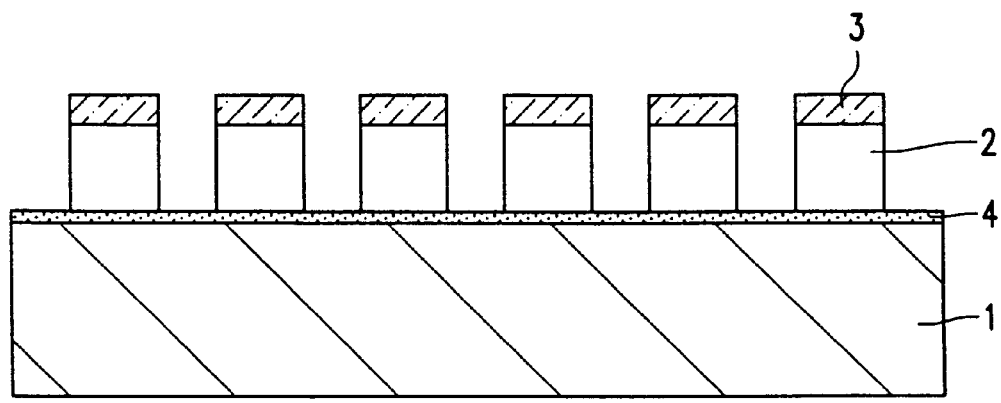

FIGS. 2 and 3 show an embodiment of the method according to the invention. As in the previous embodiment, the starting material is a relatively hard glass substrate 1 provided with an approximately 180 $\mu$m thick top coating 2 of a cured glass paste. The same manufacturing steps as in the previous embodiment are used, be it that in contrast to the previous embodiment the substrate 1 is now coated, in accordance with the present invention, with a damping layer 4 before the top coating 2 is provided. An approximately 2 $\mu$m thick aluminium layer is used for the damping layer in this embodiment. While masking a photoresist mask provided in the conventional manner, the assembly is exposed under the same conditions as in the previous embodiment to a powder spraying process 5 of aluminium oxide grains.

In this case the energetic grains are taken up by the damping layer 4 when they reach the base of the top coating 2, which damping layer entirely or at least largely absorbs the impact energy of the grains and thus neutralizes them. Consequently, the grains are not reflected or hardly reflected on the substrate so that they cannot attack the pattern of the top coating 2. The ultimate pattern 2 is therefore sharply defined, even in very fine structures, as in this embodiment, with dimensions of 90–170 $\mu$m at a pitch of 300–400 $\mu$m. At a later stage, the exposed part of the damping layer 4 may be removed, if desired, for example by etching while masking the top coating pattern 2.

The invention thus provides a method in which a layer on a relatively hard substrate can be accurately given a predetermined pattern in a controllable manner. Since the invention allows the use of top coatings having a larger rate of erosion than conventional photoresist masks, patterns with and without an internal coherence can be manufactured by means of the method according to the invention.

Although the invention has been elucidated with reference to one embodiment, it will be evident that it is by no means limited to the embodiment described and that those skilled in the art will be able to conceive many variations and forms within the scope of the invention.

For example, the invention is not limited to patterning a cured glass paste on a glass substrate, but may in principle be used advantageously for any combination of materials. Moreover, instead of aluminium, other materials may be used for the damping layer. As regards the present invention, the damping layer used is only required to be sufficiently ductile so as to absorb the impact energy of the grains completely or substantially completely.

Moreover, the invention is not limited to processes in which a photoresist mask is used, but may also be applicable to processes in which mechanical (steel) masks are used.

The invention generally provides a process in which a layer is patterned by means of a stream of kinetic particles, with a better pattern definition and a greater accuracy than comparable existing processes.

We claim:

1. A method of patterning a top coating on a substrate, comprising the steps of:

providing a damping layer on a relatively hard substrate, providing a top coating on the damping layer, providing a mask on the top coating to form a masked top coating, and exposing the masked top coating to a stream of kinetic particles.

2. The method of claim 1, wherein the step of exposing the masked top coating to a stream of kinetic particles includes a powder spraying process.

3. The method of claim 2, wherein the damping layer includes a layer of aluminum.

4. The method of claim 3, wherein the step of providing the top coating includes the steps of
      providing a bound suspension on the damping layer, and
      curing the bound suspension, and wherein the step of providing the mask further includes the steps of
      applying a photoresist layer to the top coating, and
      selectively exposing and developing the photoresist layer.

5. The method of claim 4, wherein the bound suspension includes a glass paste, the damping layer includes aluminum, and the relatively hard substrate includes a glass substrate.

6. The method of claim 3, wherein the top coating includes a glass paste, and the relatively hard substrate includes a glass substrate.

7. The method of claim 2, wherein the step of providing the top coating includes the steps of
      providing a bound suspension on the damping layer, and
      curing the bound suspension, and wherein the step of providing the mask further includes the steps of
      applying a photoresist layer to the top coating, and
      selectively exposing and developing the photoresist layer.

8. The method of claim 7, wherein the bound suspension includes a glass paste, the damping layer includes aluminum, and the relatively hard substrate includes a glass substrate.

9. The method of claim 2, wherein the top coating includes a glass paste, the damping layer includes aluminum, and the relatively hard substrate includes a glass substrate.

10. The method of claim 1, wherein the damping layer includes a layer of aluminum.

11. The method of claim 10, wherein the step of providing the top coating includes the steps of
       providing a bound suspension on the damping layer, and
       curing the bound suspension, and wherein the step of providing the mask further includes the steps of
       applying a photoresist layer to the top coating, and
       selectively exposing and developing the photoresist layer.

12. The method of claim 11, wherein the bound suspension includes a glass paste, the damping layer includes aluminum, and the relatively hard substrate includes a glass substrate.

13. The method of claim 10, wherein the top coating includes a glass paste, and the relatively hard substrate includes a glass substrate.

14. The method of claim 1, wherein the step of providing the top coating includes the steps of
  providing a bound suspension on the damping layer, and
  curing the bound suspension, and wherein the step of providing the mask further includes the steps of
  applying a photoresist layer to the top coating, and
  selectively exposing and developing the photoresist layer.

15. The method of claim 14, wherein the bound suspension includes a glass paste, the damping layer includes aluminum, and the relatively hard substrate includes a glass substrate.

16. The method of claim 1, wherein the top coating includes a glass paste, the damping layer includes aluminum, and the relatively hard substrate includes a glass substrate.

\* \* \* \* \*